(12) United States Patent
Lenchenkov

(10) Patent No.: US 7,880,168 B2
(45) Date of Patent: Feb. 1, 2011

(54) METHOD AND APPARATUS PROVIDING LIGHT TRAPS FOR OPTICAL CROSSTALK REDUCTION

(75) Inventor: Victor Lenchenkov, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 475 days.

(21) Appl. No.: 12/003,014

(22) Filed: Dec. 19, 2007

(65) Prior Publication Data

US 2009/0160983 A1    Jun. 25, 2009

(51) Int. Cl.
*H01L 31/0216* (2006.01)
*H01L 31/0236* (2006.01)

(52) U.S. Cl. ............... 257/59; 257/72; 257/291; 257/294; 257/E31.121; 257/E31.122; 257/E31.13

(58) Field of Classification Search ............ 257/59, 257/72, 291, 294, E31.121, E31.122, E31.13
See application file for complete search history.

(56) References Cited

U.S. PATENT DOCUMENTS

| | | | |
|---|---|---|---|
| 4,532,537 A * | 7/1985 | Kane | ............ 257/458 |
| 5,083,171 A | 1/1992 | Komatsu et al. | |
| 5,600,130 A * | 2/1997 | VanZeghbroeck | ........ 250/214.1 |
| 6,393,172 B1 | 5/2002 | Brinkman et al. | |
| 6,720,594 B2 | 4/2004 | Rahn et al. | |
| 6,961,088 B2 | 11/2005 | Kameshima et al. | |
| 7,183,229 B2 | 2/2007 | Yamanaka | |
| 2004/0140516 A1 * | 7/2004 | Yoshikawa et al. | .......... 257/437 |
| 2006/0138484 A1 | 6/2006 | Han | |
| 2006/0228897 A1 * | 10/2006 | Timans | ...................... 438/758 |
| 2007/0045665 A1 | 3/2007 | Park | |
| 2007/0145505 A1 * | 6/2007 | Kim et al. | ................... 257/432 |

FOREIGN PATENT DOCUMENTS

| EP | 1 758 372 A1 | 2/2007 |
|---|---|---|
| JP | 61-093766 | 5/1986 |

OTHER PUBLICATIONS

Chan, W.W.T. et al., "Cross-Talk Prevention for Power Integrated Circuits", Department of Electrical and Electronic Engineering, The Hong Kong University of Science and Technology, TENCON '95, 1995 IEEE Region 10 International Conference on Microelectronincs and VLSI, Clear Water Bay, Hong Kong, Nov. 6-10, 1995, pp. 428-431, ieeexplore.ieee.org/xpls/abs_all.jsp?arnumber=496431.

* cited by examiner

*Primary Examiner*—Victor A Mandala

(57) ABSTRACT

An imager having layers of light trapping material to reduce optical crosstalk and a method of forming the same.

4 Claims, 15 Drawing Sheets

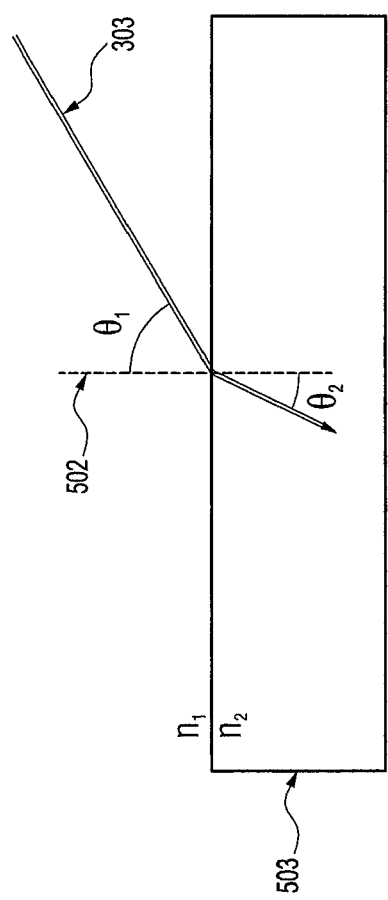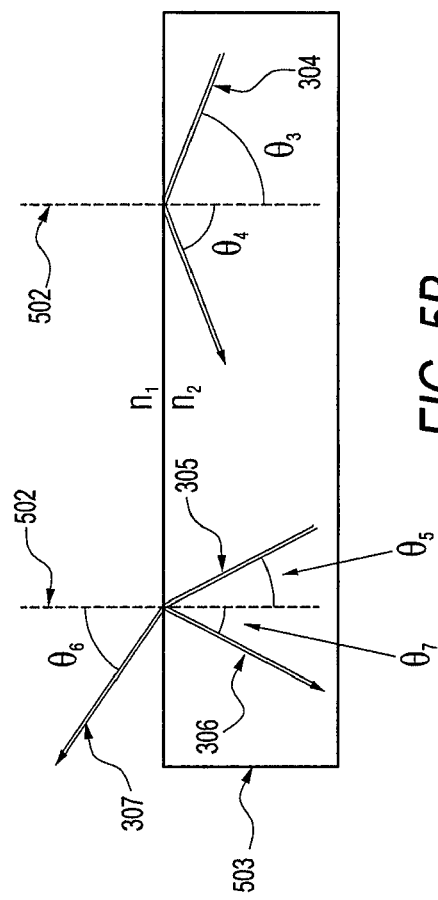

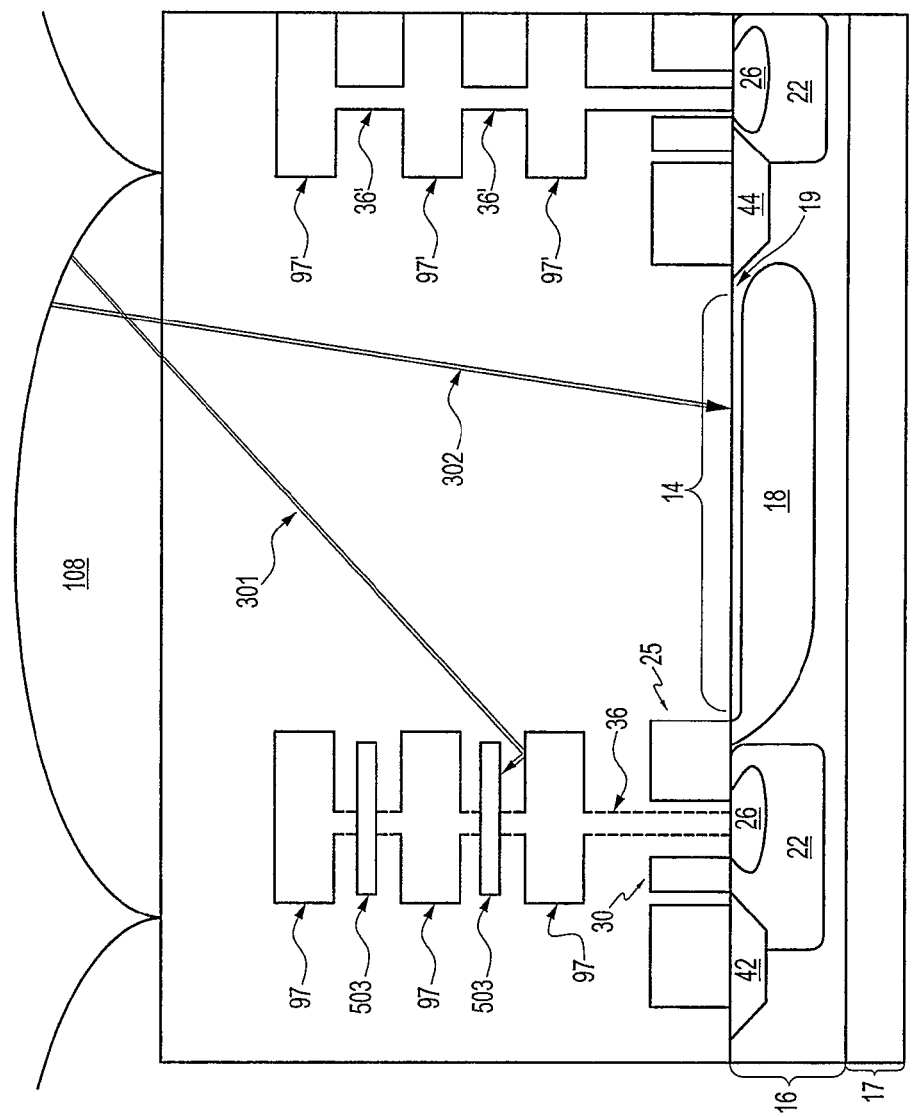

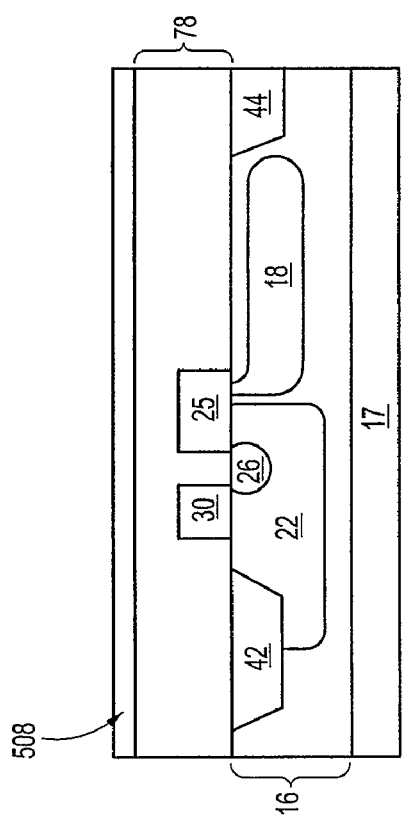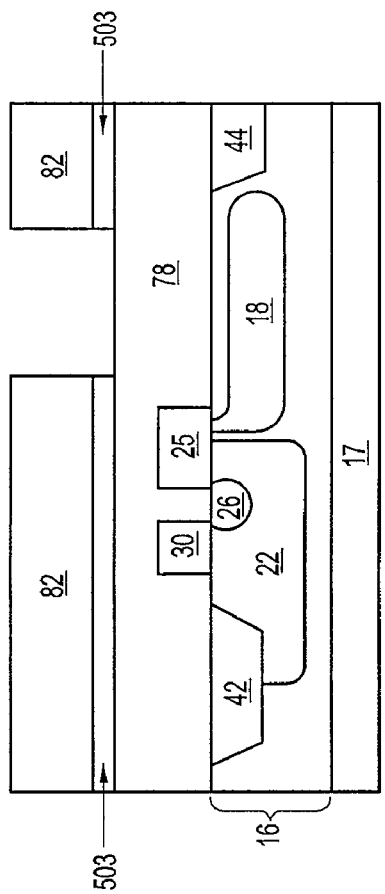
FIG. 8A
FIG. 8B

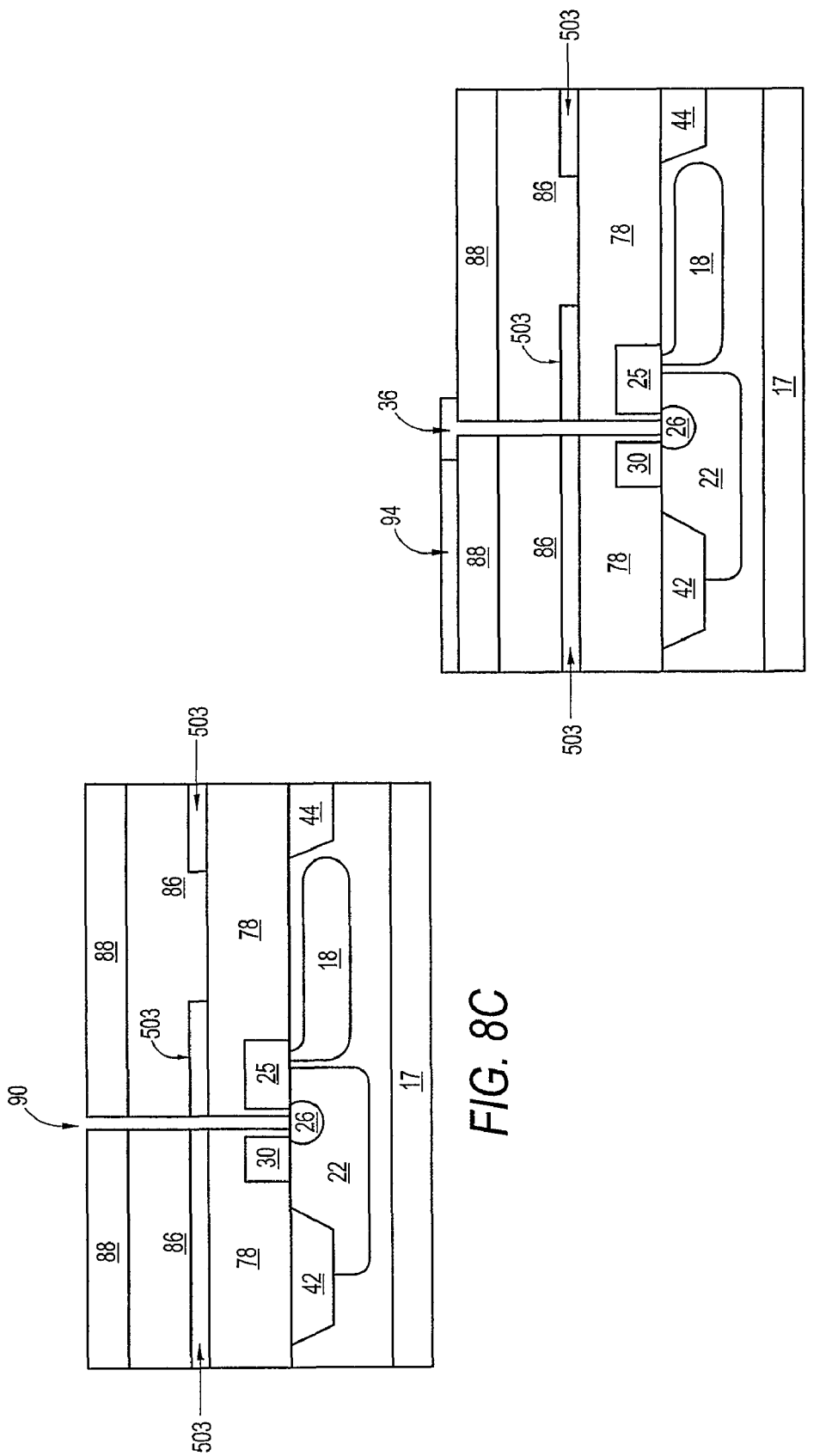

METHOD AND APPARATUS PROVIDING LIGHT TRAPS FOR OPTICAL CROSSTALK REDUCTION

FIELD OF INVENTION

Embodiments relate generally to an imager having light trapping material to prevent optical crosstalk.

BACKGROUND OF THE INVENTION

Optical crosstalk may exist between neighboring photosensors in a pixel array of a solid state imager, such as a CCD or CMOS imager, for example. Optical crosstalk in imagers can bring about undesirable results in images that they produce. The undesirable results can become more pronounced as the density of pixels in imager arrays increases, and as pixel size decreases.

In an idealized photosensor, a photodiode for example, light enters only through the surface of the photodiode representing the region of the imager that directly receives the light stimulus. In reality, however, light that should be received by neighboring photosensors also enters the photodiode, in the form of stray light, through the sides of the photosensor, for example. Reflection and refraction within the photosensor structure can give rise to the stray light, which is referred to as "optical crosstalk."

Optical crosstalk can manifest as blurring or reduction in contrast, for example, in images produced by a solid state imager. As noted above, image degradation can become more pronounced as pixel and device sizes are reduced. Degradation caused by optical crosstalk also is more conspicuous at longer wavelengths of light. Light at longer wavelengths penetrates more deeply into the silicon structure of a pixel, providing more opportunities for the light to be reflected or refracted away from its intended photosensor.

Problems associated with optical crosstalk have been addressed by adding light shields to imager structures. The light shields are formed in layers fabricated above the admitting surface through which the photosensor directly receives light stimulus. The light shield layers generally include metal and other opaque materials. The light shields, however, often reflect a significant amount of light that may still cause optical crosstalk.

Generally, the added light shields are formed as part of the uppermost layers of the imager array. Light shields have been formed, for example, in metal interconnect layers (e.g., Metal 1, Metal 2, or, if utilized, Metal 3 layers) of the photosensor's integrated circuitry. Light shields formed in such upper fabrication layers, however, have inherent drawbacks. For example, metallization layers dedicated to light shielding are limited in their normal use as conductive connections for the imager array. Additionally, light shields formed in upper device layers are separated from the light-admitting surface of the photosensor by several light transmitting layers. Moreover, the light shields are imperfect, and allow some light to pass into the light transmitting layers. Consequently, optical crosstalk still occurs through the light transmitting layers between the photosensor and the light shields. Having the light shields spaced apart from the surface of the photosensor can also increase light piping and light shadowing in the photosensors, leading to further errors in imager function.

Solid state imagers would benefit from a more efficient method of trapping incident light to reduce optical crosstalk.

BRIEF DESCRIPTION OF THE DRAWINGS

FIG. 5A is a representation of a light trap and incident light rays.

FIG. 5B is a representation of a light trap and light rays within it.

FIG. 6A is a cross-section representation of a pixel according to an embodiment described herein.

FIGS. 8A-8D are representations of a method of forming a pixel with a light trap layer according to an embodiment described herein.

DETAILED DESCRIPTION OF THE INVENTION

Figure 1:
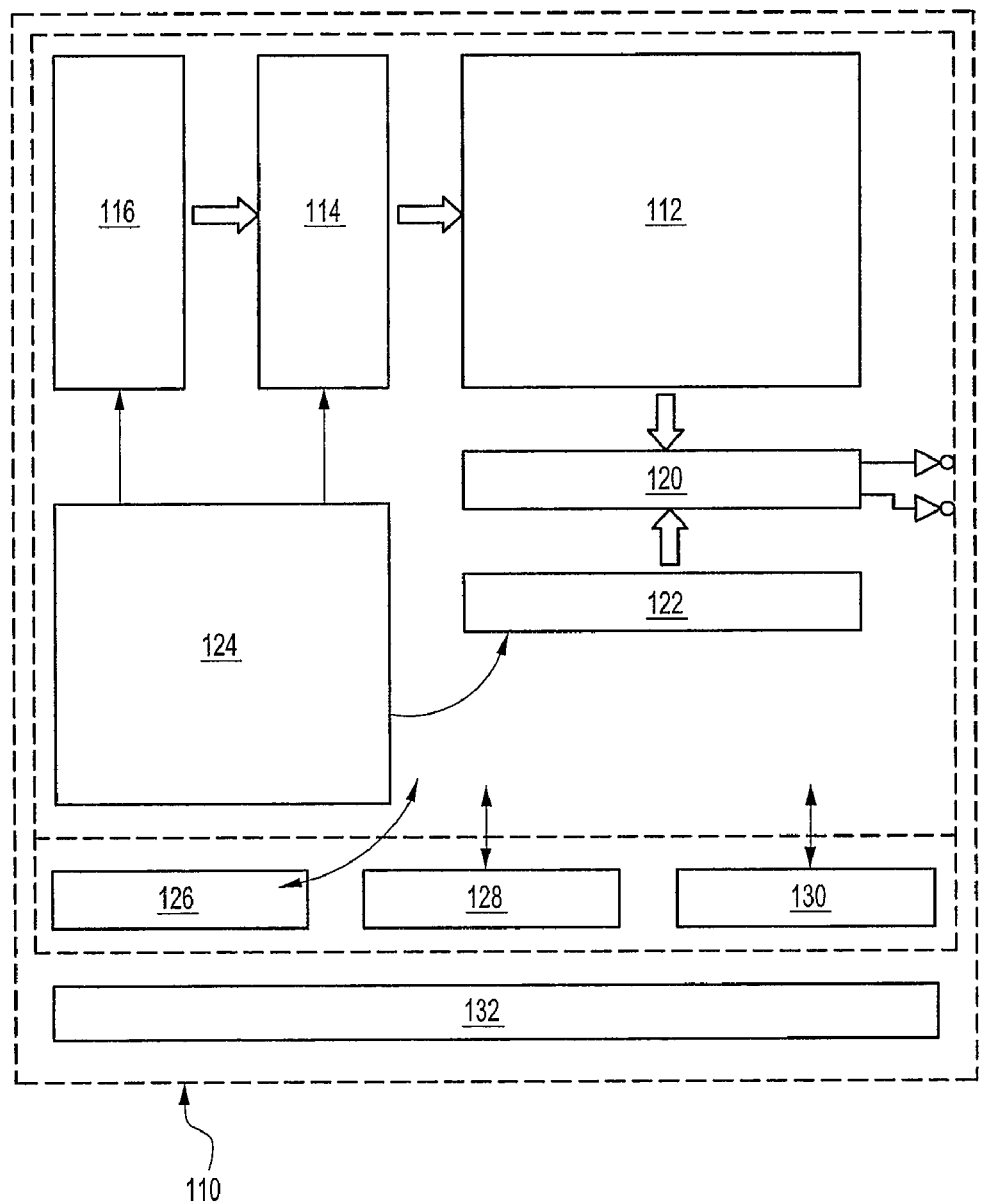
FIG. 1 is a block diagram of a solid state imager and associated components.

In the following detailed description, reference is made to the accompanying drawings which form a part hereof and illustrate specific example embodiments. It should be understood that like reference numerals represent like elements throughout the drawings. These embodiments are described in sufficient detail to enable those skilled in the art to practice them. It is to be understood that other embodiments may be utilized, and that structural, logical, and electrical changes may be made.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide, for example.

The term "light" refers to electromagnetic radiation that can produce a visual sensation (visible light) as well as electromagnetic radiation outside of the visible spectrum. In general, light as used herein is not limited to visible radiation, but refers more broadly to the entire electromagnetic spectrum, particularly electromagnetic radiation that can be transduced by a solid state photosensor into a useful electrical signal.

The term "pixel" refers to a picture element unit containing circuitry including a photosensor and transistors for converting incident electromagnetic radiation to an electrical signal. For purposes of illustration, representative pixels are illustrated in the drawings and description herein. Typically fabrication of all pixels in an imager will proceed simultaneously in a similar fashion. The following detailed description is, therefore, not to be taken in a limiting sense, and the scope of the present invention is defined by the appended claims.

The term "layer" refers to both a single layer and multiple layers, or strata. "Layer" can be understood to refer to a structure that includes multiple layers. Typically, similar fabrication steps and processes, such as patterning and etching, are applied to all layers in the structure. Adjacent layers can be patterned and etched simultaneously.

FIG. 1 illustrates a block diagram of a CMOS imager 110 having a pixel array 112 incorporating pixels 11, 12, 13 (FIG. 3) arranged in columns and rows. The pixels of each row in pixel array 112 can all be turned on at the same time by a row select line and the pixels of each column are selectively output by a column select line. A plurality of row and column lines is provided for the entire pixel array 112. The row lines are selectively activated by a row driver 114 in response to a row address decoder 116 and the column select lines are selectively activated by a column driver 120 in response to a column address decoder 122.

The CMOS imager 110 is operated by a control circuit 124 which controls the address decoders 116, 122 for selecting the appropriate row and column lines for pixel readout, and the row and column driver circuits 114, 120 which apply driving voltage to the drive transistors of the selected row and column lines. A memory 126, e.g., a FLASH memory or an SRAM, can be in communication with the pixel array 112 and control circuit 124. A serializer module 128 and SFR (Special Function Register) device 130 can each be in communication with the control circuit 124. Optionally, a localized power source 132 can be incorporated into the imager 110.

Typically, the signal flow in the imager 110 would begin at the pixel array 112 upon its receiving photo-input and generating a charge. The signal is output through the row driver 120 to a read-out circuit and then to analog-to-digital converters 814, 816 (FIG. 9B). The digitized signal is processed by digital processing components 830 (FIG. 9B).

Solid state imagers, such as CMOS imagers, may be formed on a substrate with a number of layers stacked above it. Many methods of forming layered devices on a substrate are known in the art. A number of components may be formed or placed on the substrate, such as photosensitive regions and transistors. In a solid state imager, the photosensitive regions are typically used to create a charge in response to incident light, and the transistors are used to read out that charge and create an image from a set of photosensitive regions.

When light reaches the top surface of an imager, it is preferred that all light rays are eventually converted into charge by the photosensitive element (also called a photosensor) that is associated with the area of the imager the light ray first reached. Refraction and reflection within the layers of the device, described below with reference to FIGS. 4A and 4B, may cause light rays to be diverted within the imager and stored as charge in the wrong photosensor. This causes aberrations in the resultant image, as some pixels have registered more light than they should have received. Accordingly, there is a need for an imager design that prevents the negative effects associated with incident light that is deflected to incorrect photosensitive elements.

Embodiments described herein provide an imager formed as a CMOS integrated circuit using standard CMOS fabrication processes. Embodiments provide fabrication methods and resulting pixel array structures in which individual fabrication layers are patterned into sections serving assorted purposes. For example, a polysilicon layer traditionally is patterned to develop transistor gate structures for pixel circuitry. Sections of other fabrication layers, besides transistor gate polysilicon layers, can be used for light trapping. Layers used for light trapping are fabricated to include regions of light-trapping materials, such as nanotextured or porous silicon. These light trapping layers may be fabricated between any other layers in the imager and are not limited in position to the embodiments described below.

Embodiments are described below in connection with CMOS imagers. The imager described below includes a number of pixels, each having a photosensor formed as a photodiode, for accumulating photo-generated charge in an underlying portion of the substrate. It should be understood, however, that the imager may include a photogate, or any other image-to-charge converter or transducer, in lieu of a photodiode. The embodiments are not limited by the type of device used to accumulate or otherwise obtain photo-generated charge. It should also be noted that while embodiments are described in relation to four-transistor (4T) pixels of a CMOS imager, other pixel structures and other types of solid state imagers may be used.

Figure 2:
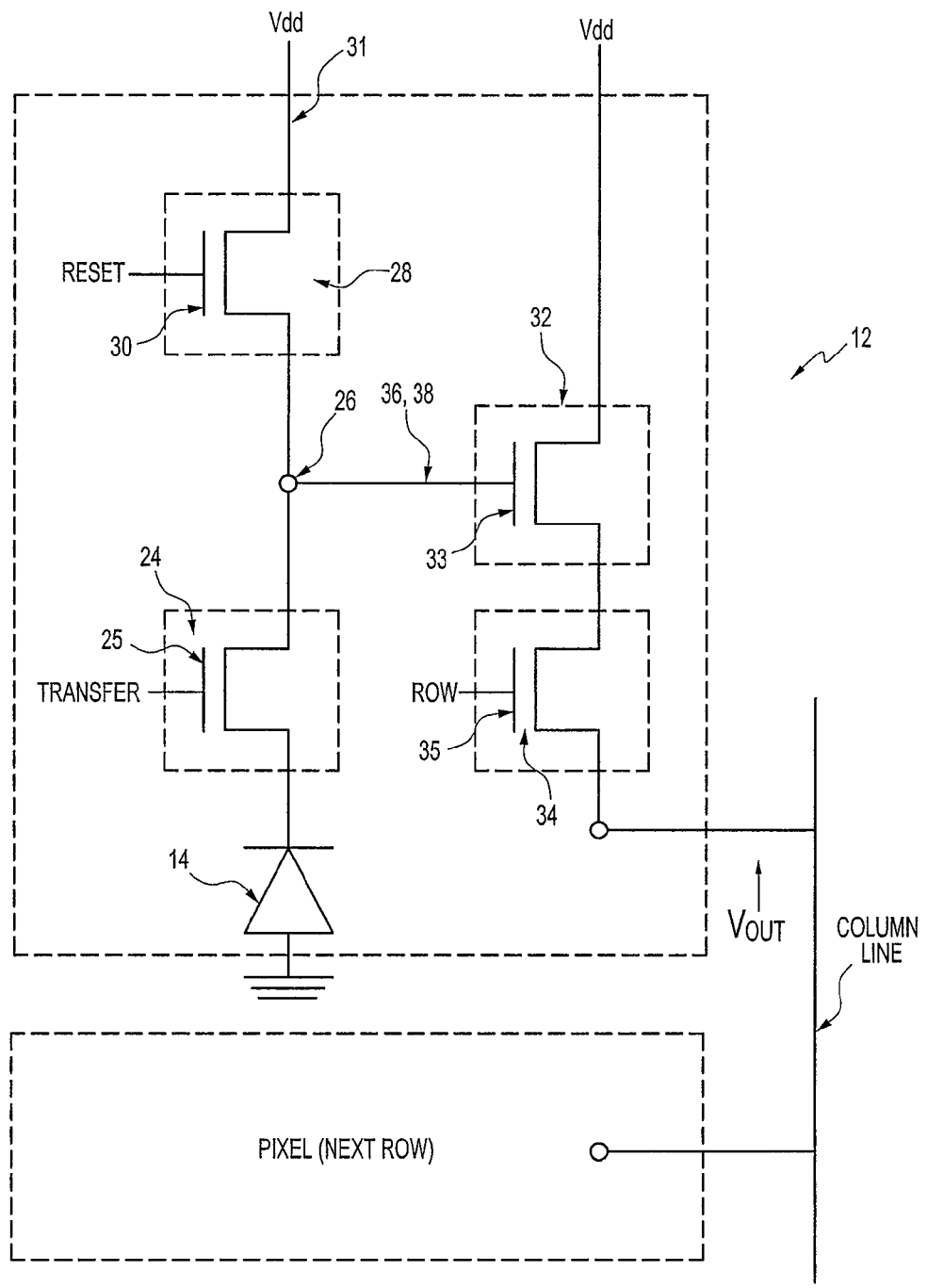
FIG. 2 is a schematic of a conventional 4T pixel.

A conventional four transistor (4T) CMOS image sensor pixel 12 is shown in FIG. 2. The pixel 12 includes a photosensor 14 (e.g., photodiode), transfer transistor 24 (having a gate 25), floating diffusion region 26, reset transistor 28 (having a gate 30), source follower transistor 32 (having a gate 33), and row select transistor 34 (having a gate 35). The photosensor 14 is connected to the floating diffusion region 26 by the transfer transistor 24 when the gate 25 is activated by a transfer control signal TRANSFER.

The reset transistor 28 is connected between the floating diffusion region 26 and a voltage supply line Vdd. A reset control signal RESET is applied to reset transistor gate 30 to activate the reset transistor 28, which resets the floating diffusion region 26 to the voltage supply line Vdd level as is known in the art.

The source follower transistor 32 is connected between the voltage supply line Vdd and the row select transistor 34. Source follower transistor gate 33 is connected to the floating diffusion region 26. The source follower transistor 32 converts the charge stored at the floating diffusion region 26 into an electrical output voltage signal Vout. The row select transistor 34 is controllable by gate 35 (activated by a row select signal ROW) for selectively connecting the source follower transistor 32 and its output voltage signal Vout to a column line of a pixel array.

The representative pixel 12 is operated as is known in the art by RESET, TRANSFER, and ROW control signals. As an example of an alternative exemplary circuit configuration, the 4T pixel 12 can be converted to a three transistor (3T) pixel by removal of the transfer transistor 24, and electrically coupling the photodiode 14 output to the floating diffusion region 26. Also, the floating diffusion region 26 is connected to the source follower gate 33 of the source follower transistor 32 in the 3T pixel circuitry.

Figure 3:
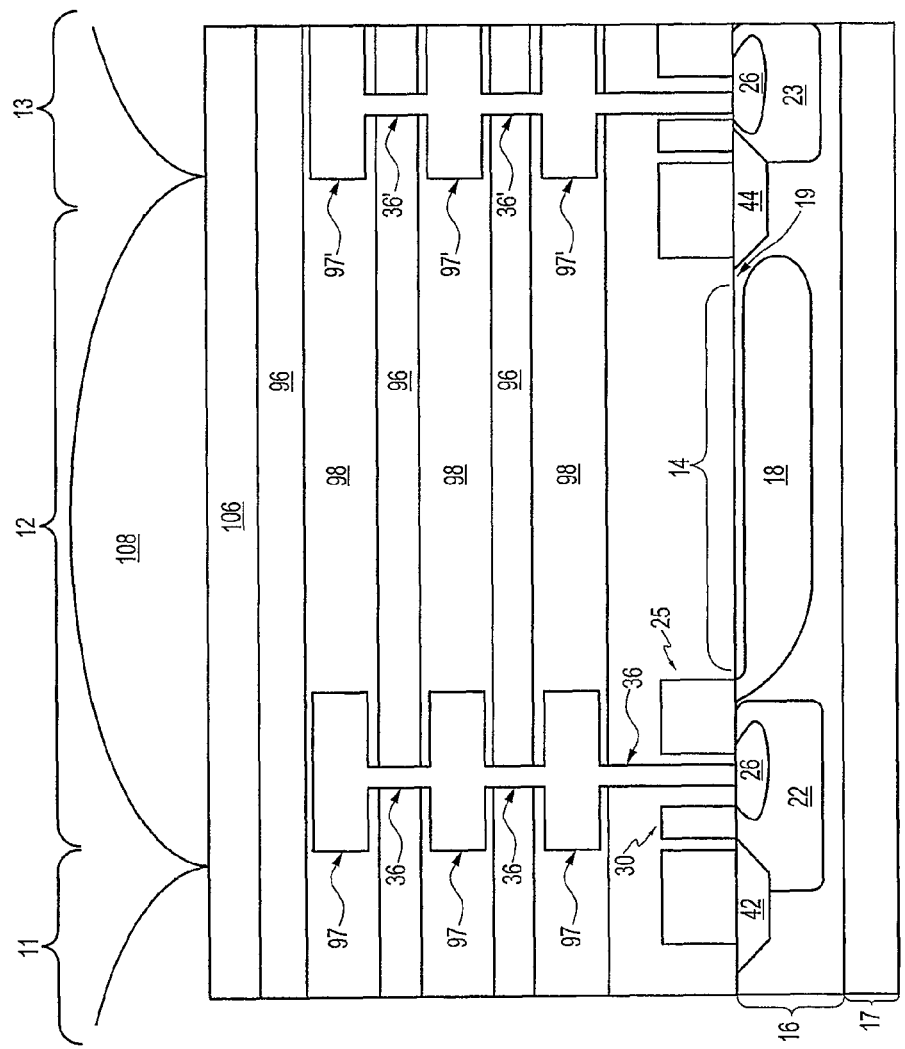
FIG. 3 is a cross-section representation of a pixel in the prior art.

FIG. 3 shows in cross-section a portion of CMOS pixel 12 and portions of adjacent pixels 11, 13. The schematic circuit representation of the pixel 12 may be identical to FIG. 2. The circuit is shown as a four transistor (4T) pixel, though, as noted, the pixel may have any of several circuit configurations. Portions of the FIG. 2 circuit appear in the FIG. 3 cross section, including photosensor 14, transfer gate 25 (of transfer transistor 24), reset gate 30 (of reset transistor 28), and a floating diffusion node 26.

Pixel 12 of the imager array includes the photosensor 14 formed by implantation in an p-type epitaxial (EPI) layer 16, which is over a p-type substrate 17. An n-type conductivity region 18 is provided in EPI layer 16 and accumulates photo-generated charge when exposed to light. The portion of EPI layer 16 above the n-type conductivity region 18 is a thin p-type conductivity region 19. The pixel 12 further includes a doped p-well 22 defined in EPI layer 16. An identical p-well 23 is provided in EPI layer 16 as part of pixel 13. The transfer gate 25 is formed above a portion of p-well 22 and adjacent the photosensor 14. The transfer gate 25 serves as part of the transfer transistor 24 (FIG. 2) for electrically gating charges accumulated by photosensor 14 to floating diffusion region 26 implanted in a portion of p-well 22. The reset gate 30 is formed as part of the reset transistor 28 (FIG. 2).

A conductor 36 at the floating diffusion region 26 is in electrical communication with the source follower gate 32 of the source follower transistor 33 through another conductor 38 (FIG. 2). Conductor 36 routes through a conductive path in an interconnect layer 96 (e.g., the M1 layer). Lateral isolation between adjacent pixels 11, 12 and adjacent pixels 12, 13 is provided by shallow trench isolation (STI) region 42 and STI region 44, respectively.

Above the EPI layer 16 are a number of layers 96, 98 of transparent or translucent material, such as silicon dioxide ($SiO_2$). Some of these layers 98 enclose metal connectors 97, 97' for passing electric signals to and from the pixels 11-13. Such layers 98 are called "metal layers." Other layers 96 contain no metal connectors 97, 97', though such layers might include smaller amounts of metal (called interconnects 36) for connecting the various metal layers 98 with each other and the components on the EPI layer 16, such as floating diffusion 26. Above these layers 96, 98, there may be a color filter 106, such as a Bayer color filter as is known in the art. The color filter 106 filters the light that enters a pixel for a particular range of wavelengths, such as red, green, or blue light ranges. If such a color filter 106 is used, each pixel 11-13 represents photocharge of only one of these color ranges. Techniques known in the art may be used to process the pixels 11-13 and integrate the surrounding color information into each single-color pixel 11-13.

In some solid state imagers, microlenses 108 may be formed or placed above the layers 96, 98 on the substrate. Each microlens 108 may be associated with a photosensor 14 located directly below it on the substrate. In such a configuration, the microlens 108 focuses incident light to the photosensor 14 below it, increasing the amount of light that is received by the photosensor 14 (and thus the photocharge stored in the n-type region 18).

Figure 4A:
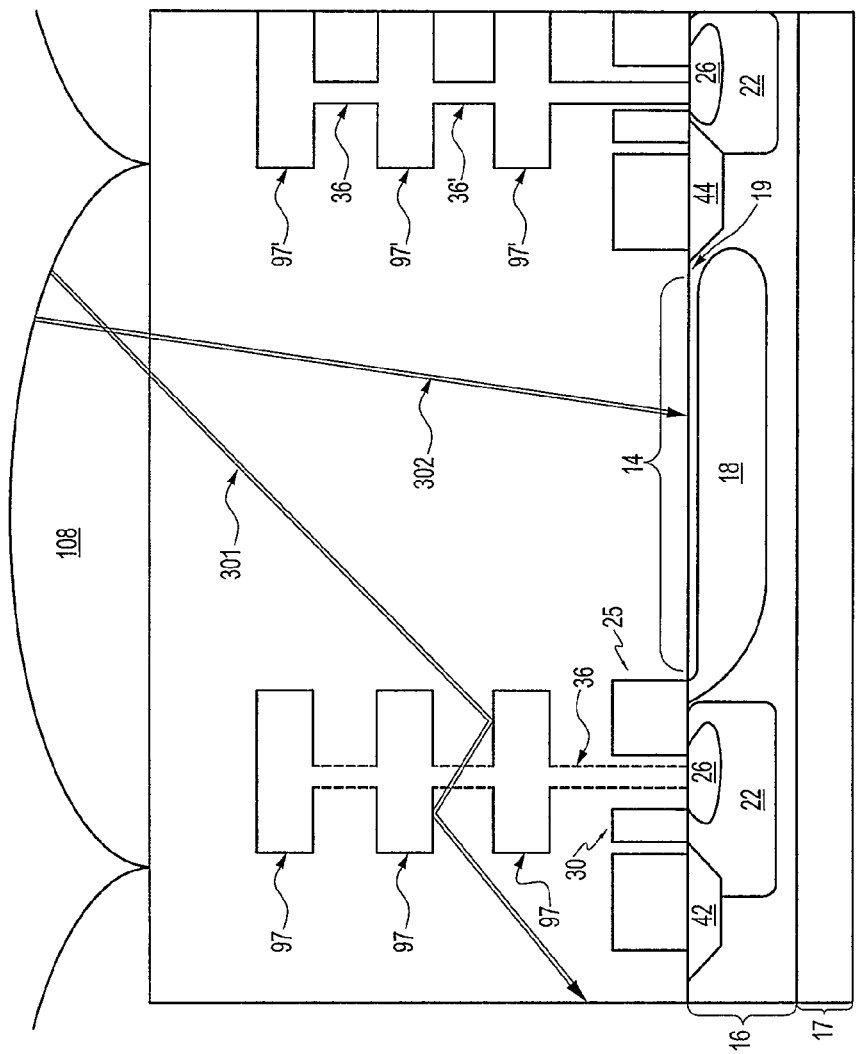
FIG. 4A is a cross-section representation of a pixel in the prior art.
Figure 4B:
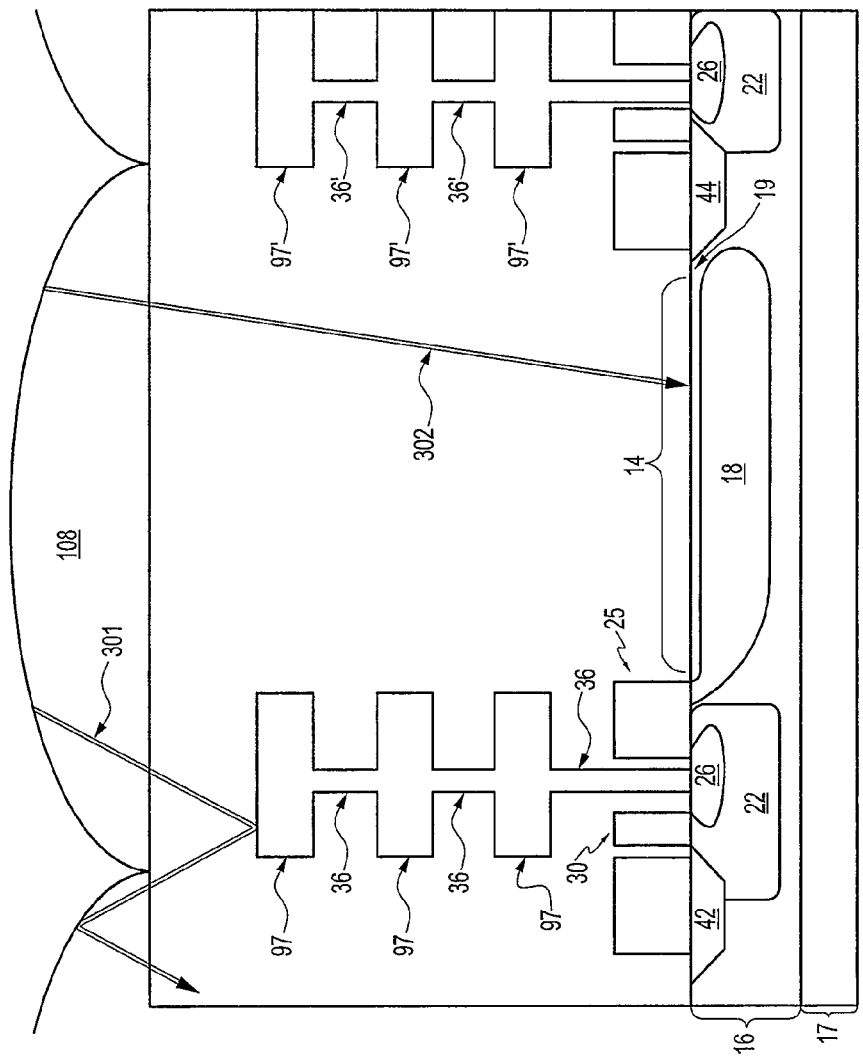
FIG. 4B is a cross-section representation of a pixel in the prior art.

FIGS. 4A and 4B depict the imager of FIG. 3 with two light rays 301, 302. Throughout the figures, light rays will be indicated by double arrows to distinguish from single lines, which indicate an element associated with a reference numeral. For illustration purposes, the layers 96, 98 above the EPI layer 16 are not shown. Additionally for illustration purposes, the interconnects 36 within pixel 108 in FIG. 4A are indicated by a dashed outline, however this is not intended to show a structural difference from FIG. 3. As shown in FIGS. 4A and 4B, light ray 302 is incident on microlens 108 for pixel 12, and is directed to the photosensor 14 below the microlens 108. This is the preferred outcome, as the light ray 302 is received by and generates charge on the photosensor 14 associated with the microlens 108 that received the light ray 302. Light ray 301, however, enters the microlens 108 at an angle such that it does not reach the appropriate photosensor 14. Instead, it reflects off a metal connector 97, subsequently reflecting off metal connectors 97 several times (in the case shown in FIG. 4A) or reflecting internally off a microlens (in the case shown in FIG. 4B) before it eventually crosses into pixel 11, where it may be received by and generate charge on the photosensor in that pixel 11. This leads to an incorrectly raised photocharge in the pixel 11, causing aberrations in the eventual image. In order to prevent this undesirable effect, it is desirable to have some means to trap light rays traveling along incorrect trajectories, such as light ray 301.

Materials may be formed such that they trap almost all light that strikes them. This phenomenon is known as total internal reflection and is dependent on the indices of refraction of the light trapping material and the material surrounding it. The index of refraction is a physical constant that varies from material to material and determines the amount of deflection that a light ray exhibits when crossing the interface between two materials. In FIG. 5A, for example, light trap 503 has a different index of refraction ($n_2$) than the surrounding material (having index of refraction $n_1$). Angles $\theta_1$ and $\theta_2$ (measured from normal line 502) are related to the relative indices of refraction as follows:

$$\frac{\sin(\theta_1)}{\sin(\theta_2)} = \frac{n_2}{n_1}.$$

In FIG. 5A, light trap 503 is composed of a material having an index of refraction $n_2$ that is surrounded by a material having an index of refraction $n_1$. For the light trapping area 503 to exhibit total internal reflection, $n_2$ must be larger than $n_1$. When light ray 303 passes from the surrounding material into the light trapping material, it is refracted because of the difference in indices of refraction.

When the light ray 304 (FIG. 5B) reaches the interface between light trap 503 and the surrounding material, however, it will be completely reflected (and thus will stay within the light trap 503) if it strikes the interface at an angle (again measured from normal line 502) greater than the critical angle $\theta_c$ (not shown), which is given by $$\sin^{-1}\left(\frac{n_1}{n_2}\right).$$

For example, if the index of refraction for the surrounding material is 1.5, and the index of refraction for the light trapping material is 3, then $\theta_c$ is equal to $$\sin^{-1}\left(\frac{1.5}{3}\right),$$

or 30°. In that example, a light ray that is on a path to escape will be completely reflected unless it reaches the interface between light trap 503 and the surrounding material at an angle less than 30°. As shown in FIG. 5B, angle $\theta_3$ is greater than $\theta_c$ and thus light ray 304 is reflected back into the light trap 503 (at an angle $\theta_4$ equal to $\theta_3$), while angle $\theta_5$ is less than $\theta_c$, so light ray 305 escapes the light trap 503 (due to refraction, it escapes at a different angle $\theta_6$). Even if the light ray reaches the interface at an angle less than $\theta_c$, only a fraction of it (represented by light ray 307) will escape the light trapping area. The remainder, indicated by light ray 306, is reflected internally (at an angle $\theta_7$, equal to $\theta_5$) and trapped within light trap 503.

As described above, if the index of refraction of the light trap is twice the index of refraction of the surrounding area, the critical angle will be 30°, however increasing the ratio of the indices of refraction can decrease that angle further. If the light trap has an index of refraction that is three times the index of the surrounding area, the critical angle will instead be approximately 19.5°. The light trapping area may be composed of any material having a suitable index of refraction, such as Si, Ge, SiN, SiC, $TiO_2$, and $Al_2O_3$. The embodiments described herein are not limited to this specific set of materials, however, and one skilled in the art may find other combinations that are more suited to a particular purpose. It will be apparent to one skilled in the art that the materials used for the light trap 503 and the surrounding material may be selected from a wide variety of materials, with varying results, based on the specific needs of the overall device. Light traps may be created from any material, so long as it has an index of refraction sufficiently higher than its surrounding material.

Many of the layers 96, 98 shown in FIG. 3 may be formed using borophosphosilicate glass (BPSG) or silicon dioxide. These layers have an index of refraction of approximately 1.4-1.6, however materials used for these layers may also have other indices of refraction (preferably ranging from about 1.3 to about 2.5). Because total internal reflection is dependent on the difference between the indices of refraction between the light trap material and the surrounding material, the light trap material must be in part selected based on its index of refraction.

One material suitable for light trapping in silicon dioxide or BPSG is porous silicon, a form of silicon containing a large number of tiny pores, often with diameters of 50 nanometers or less and having very irregular surfaces. Porous silicon may be created by several methods known in the art, such as anodization, stain etching, sputtering, track etching, and many others. Another such material is nanotextured silicon, a form of silicon which is formed by a process described below with reference to FIGS. 7A-7F to create a texture similar to that of porous silicon. Because nanotextured silicon has irregular surfaces similar to those of porous silicon, it also exhibits total internal reflection for incident light, acting as a black body that absorbs whatever light strikes it. To create nanotextured silicon in a layer of dielectric, for example, a process similar to that shown in FIGS. 7A-7F may be used, as described below.

Because different materials have different indices of refraction and absorptive properties, a light trap constructed of one material may need to be thicker than another light trap of a material with a higher index of refraction. For example, a silicon nitride trap (having n≈2) should be thicker than a tungsten silicide trap (n≈4) having an equivalent level of light trapping.

Figure 6B:
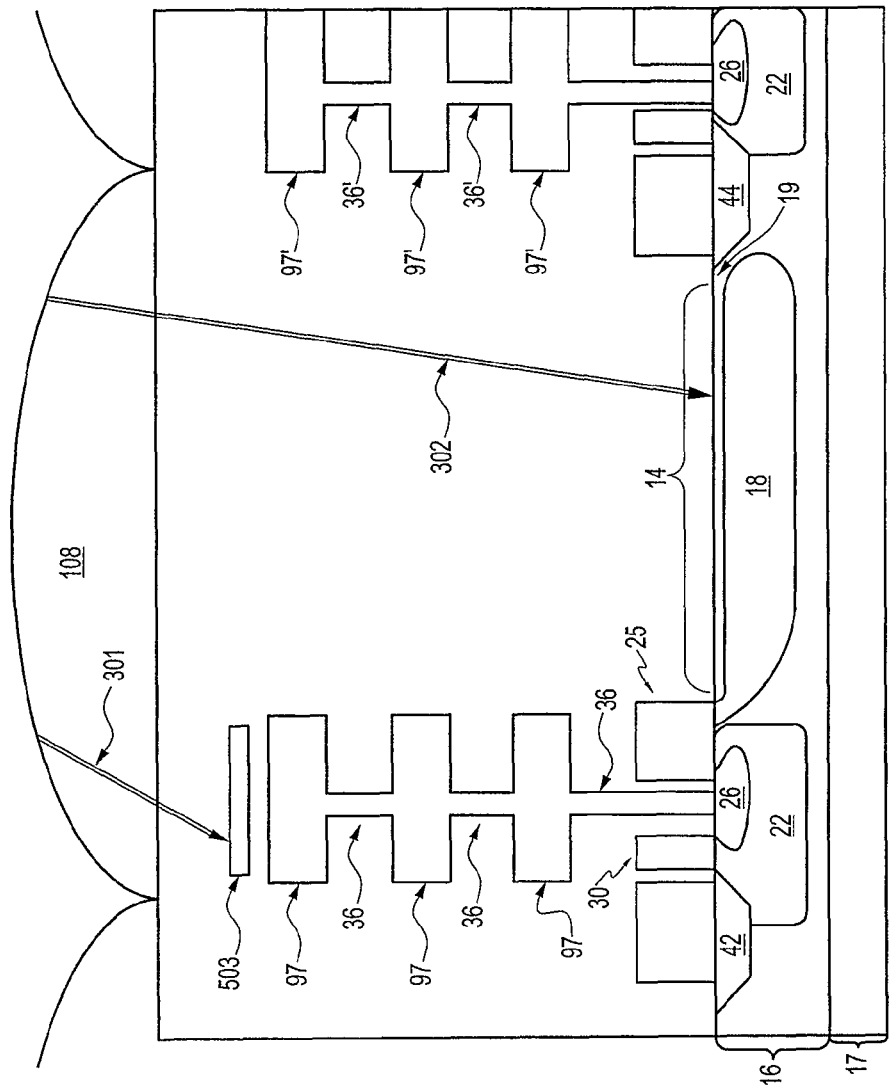
FIG. 6B is a cross-section representation of a pixel according to an embodiment described herein.

FIGS. 6A, 6B depict the imager of FIGS. 4A, 4B, respectively, with the addition of light trapping regions 503. The light trapping regions 503, disposed between metal connectors 97, may comprise nanotextured or porous silicon, as discussed above, or they may comprise other such materials known in the art that are suited to total internal reflection. As shown in FIGS. 6A, 6B, light ray 301 (and any light ray that similarly is reflected by metal connectors 97 or microlens 108) is absorbed by light trapping regions 503. Light trapping regions 503 comprise a material that has light-absorptive properties. As discussed above, nanotextured and porous silicon exhibit this property, as do many other materials. This phenomenon leads to a black body effect, in that the light trapping regions 503 absorbs most, if not all, light that reaches them. Because light cannot be "piped" between the metal connectors 97, as was the case in FIG. 4A, or reflected by metal connectors 97 and an adjacent microlens 108, as shown in FIG. 4B, optical crosstalk is reduced.

Figure 7A:
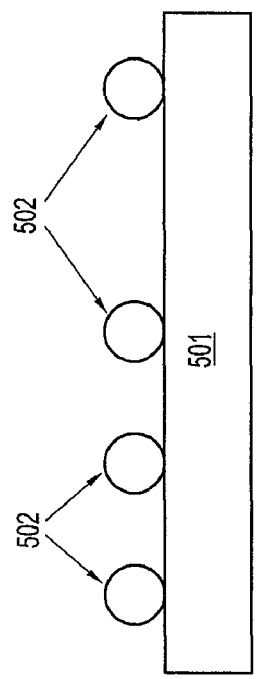
FIGS. 7A-7F are representations of a method of forming a light trap on a layer of dielectric according to an embodiment described herein.
Figure 7B:
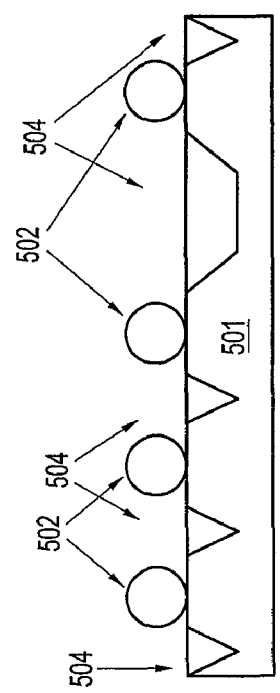
Figure 7C:
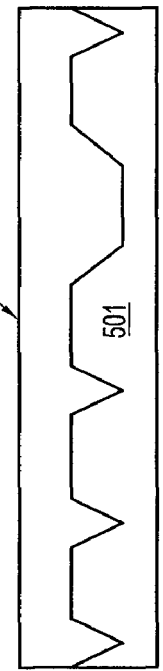

FIGS. 7A-7F show an example fabrication process for nanotextured silicon in cross-sectional views. In FIG. 7A, a layer 501 of silicon dioxide, for example, has been deposited above a substrate. This layer 501 could be any layer 96, 98 as shown in FIG. 3, or it could be a layer not shown in FIG. 3, as needed by a particular imager. Using deposition techniques known in the art, nanoparticles 502 are deposited on the layer 501. The layer 501 and nanoparticles 502 are then subjected to a process, such as etching, to corrode the layer 501 and create gaps 504 between the nanoparticles 502 (FIG. 7B). FIG. 7B is not drawn to scale; for illustration purposes the nanoparticles 502 are depicted as much larger relative to the light trap layer 508 than the nanoparticles 502 might be in practice. After the gaps 504 have been created, the nanoparticles 502 are removed. A new light trap layer 508, composed of tungsten silicide, for example, is deposited on layer 501 (as shown in FIG. 7C). This new layer fills in the gaps 504 on the layer below, giving it a rough, textured bottom surface.

Figure 7D:
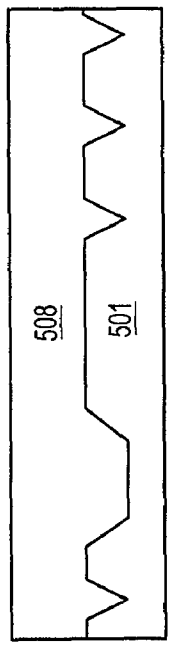
Figure 7E:
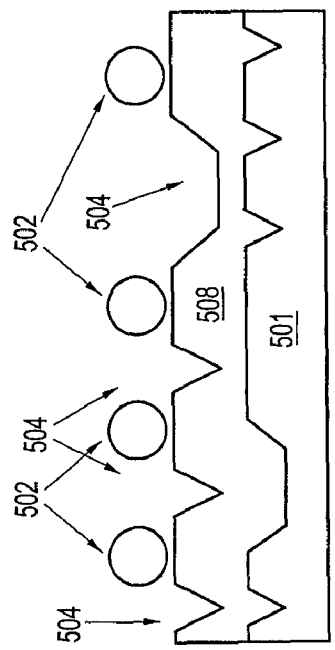
Figure 7F:
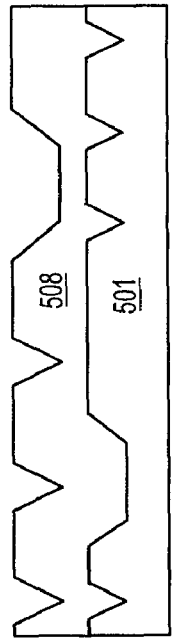

FIG. 7D shows a possible product of the process described above with reference to FIGS. 7A-7C. As shown in FIG. 7E, after the light trap layer 508 is deposited additional nanoparticles may be deposited on its upper surface, and a process, such as etching, is used to create gaps 504 in its upper surface between nanoparticles 502. FIG. 7F shows the layers 501, 508 after the nanoparticles 502 are removed, demonstrating the texturing effect on both surfaces of light trap layer 508. This texturing effect increases the absorption of light by the silicon regions, as the irregular surface makes it very unlikely that light rays will strike the interface regions at a small angle relative to normal. As discussed above, with reference to FIGS. 5A, 5B this increases total internal reflection.

FIGS. 8A-8D show more completely one example pixel fabrication method for an imager featuring a 4T pixel 12. FIG. 8A shows a preliminary stage of fabrication in which the p-type EPI layer 16 has been provided over a p-type substrate 17. The trench isolation regions 42, 44, for example, are formed within the EPI layer 16 and surround active regions of pixel 12. The trench isolation regions 42, 44 preferably are shallow trench isolation (STI) regions, but may also be formed without limitation by local oxidation of silicon (LOCOS) processing, for example.

Referring to FIG. 8B, the transfer gate 25, the reset gate 30, the source follower gate 33, and the row select gate 35 are formed (only gates 25 and 30 are shown in FIG. 8B). The p-well regions 22 are formed in the layer 16, and the transfer gate 25 and reset gate 30 are formed on the EPI layer 16. The n-type floating diffusion region 26 is formed in the EPI layer 16 adjacent the transfer gate 25. A dielectric layer 78 is deposited over the pixel 12, including the transfer gate 25 and reset gate 30. This dielectric layer 78 should be optically transparent so as not to impede light from reaching the photodiode 14. The dielectric layer 78 can comprise, e.g., silicon oxides or nitrides, glasses, or polymeric materials, and can be deposited by evaporative techniques, CVD (chemical vapor deposition), PECVD (plasma enhanced CVD), sputtering, or other techniques known in the art.

A light trapping layer 508 may then be formed over the dielectric layer 78 by depositing a layer of nanotextured silicon, porous silicon, or other suitable light trapping material. Though any material that exhibits total internal reflection may be used, the discussion below will make reference exclusively to silicon as an example. This is merely an illustration of one embodiment of the invention and should not be taken as a limitation thereof. Preferably, the light trapping layer 508 is between 200 nm and 400 nm in thickness, but any thickness may be used depending on the application. The process of forming the light trapping layer 508 may be performed as described above with reference to FIGS. 7A-7F. The light trapping layer 508 can be deposited on the dielectric layer 78 by conventional methods, such as by evaporation techniques, physical deposition, sputtering, CVD, etc., as either a planar layer or a conformal layer.

Next, as shown in FIG. 8B, a patterned photoresist mask 82 is formed on the desired light trapping region, and the light trap 503 is etched to form an aperture over the photodiode 14. The dielectric layer 78 can serve as an etchstop. The photoresist mask 82 is formed in a pattern to etch only portions of the light trap 503. If desired, the light traps 503 may be etched such that the light trapping regions occupy the same pattern as the connectors in the metal layers adjacent the light trapping layer 508. The light trapping layer 508 may be etched only in the region directly over the photosensor 14, in order to create light traps 503 in all other regions. Such a pattern may create a light trap 503 with apertures etched out in a regular pattern representing the pattern of photosensors 14 beneath. Alternatively, the light trapping layer 508 can be arranged such that it overlaps the shallow trench isolation regions in the substrate below, or any other pattern that may be desirable.

As shown in FIG. 8C, a second dielectric layer 86 is deposited over the light trap 503 and within the aperture over the first dielectric layer 78. The second dielectric layer 86 can be the same or similar in compositional, light transmission, and dielectric properties as the first dielectric layer 78 and can be deposited in a similar fashion. The second dielectric layer 86 can be planarized by CMP or RIE etching techniques, or alternatively, can be a conformal layer. A patterned photoresist 88 is formed over the second dielectric layer 86. Subsequent etching forms opening 90, for example, through the two dielectric layers 78, 86 and the light trap 503, exposing gates and active areas in the substrate, such as floating diffusion region 26. The openings provide access for making interconnections between elements of the pixel circuitry, to a supply voltage, and to output and control circuits.

Conductors for active circuit areas of the pixel 12, for example, are formed within openings such as opening 90, shown in FIG. 8D. One such conductor 36 is shown to connect with the floating diffusion region 26. Over the second dielectric layer 86 and in electrical communication with the conductor 36, an interconnect layer 94, preferably of metal, is deposited to form an M2 layer. Generally, the conductive interconnect layer 94 should not extend over the aperture 90, or photodiode 14, for example, particularly if the conductive interconnect layer is composed of an opaque or translucent material. However, transparent or semi-transparent materials, e.g., polysilicon, can be used for the conductive interconnect layer 94, and can overlie the photodiode 14, if desired.

The floating diffusion region 26 is electrically connected with the source follower gate 32 through standard metallization steps, e.g., a conductor 36 connects to the floating diffusion region 26 and the second conductor 38 (see FIG. 2) connects to the source follower gate 32, between which is formed a conductive interconnect layer 94. Conductor 36 is in electrical communication with the M2 conductive interconnect layer 94 and thereby with the source follower gate 32 and the rest of the integrated circuit, of which the photodiode 14 is a part for supplying transduced charge to the pixel switching circuitry. Additional processing can follow, such as formation of an overlying dielectric layer 96 and a third conductive interconnect layer 98 (M3), as known in the art. It should be understood that FIG. 8D only shows one conductive via as exemplary. Other vias as needed for operation of the pixel are similarly formed.

Additional features of the pixel structure fabricated after the FIG. 8D steps may include passivation layers, color filter array 106 (FIG. 3), polyimide layer, and microlenses 108 (FIG. 3), for example.

Figure 9A:
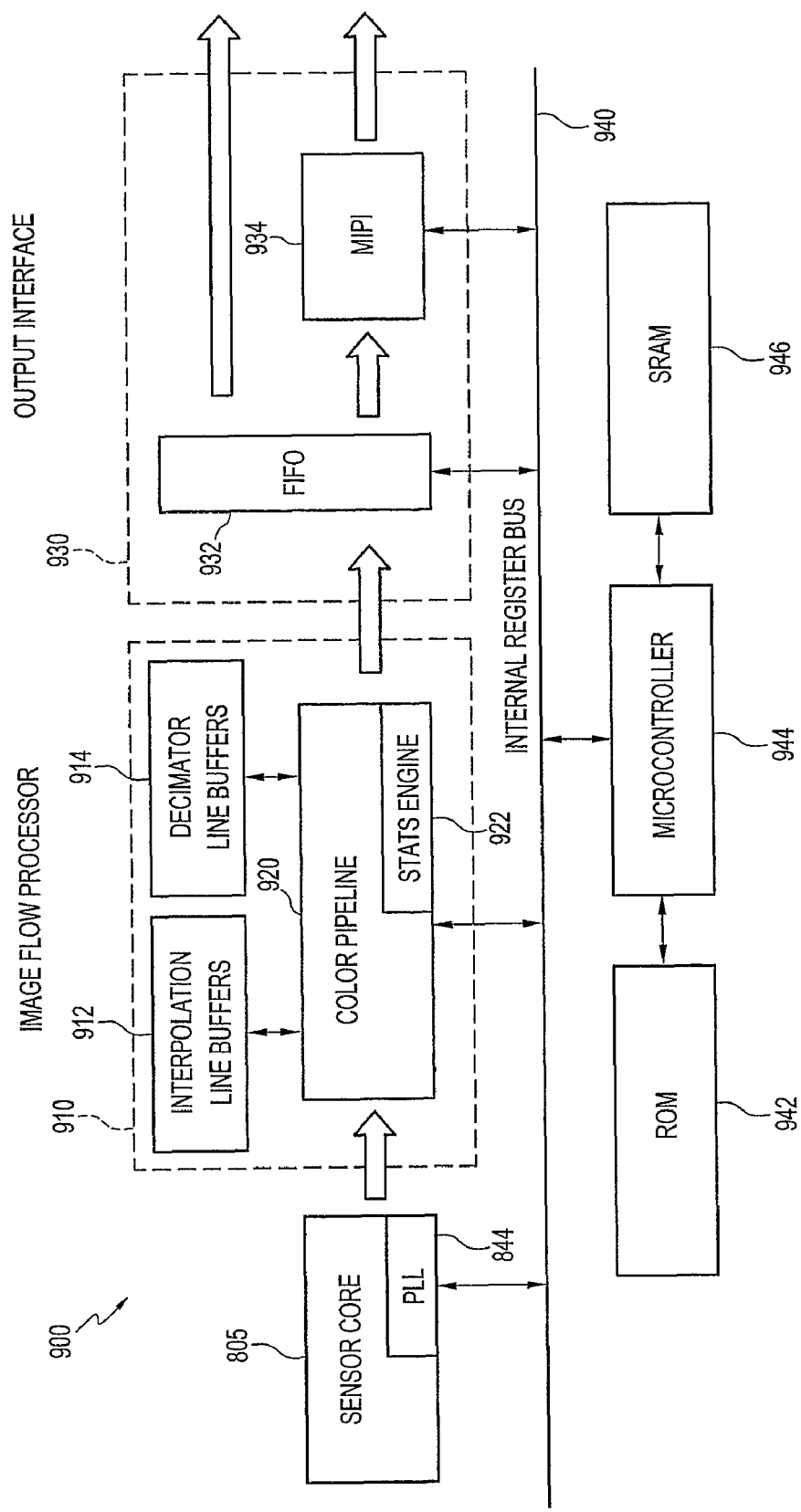
FIG. 9A is a block diagram of system-on-a-chip imager constructed in accordance with an embodiment.
Figure 9B:
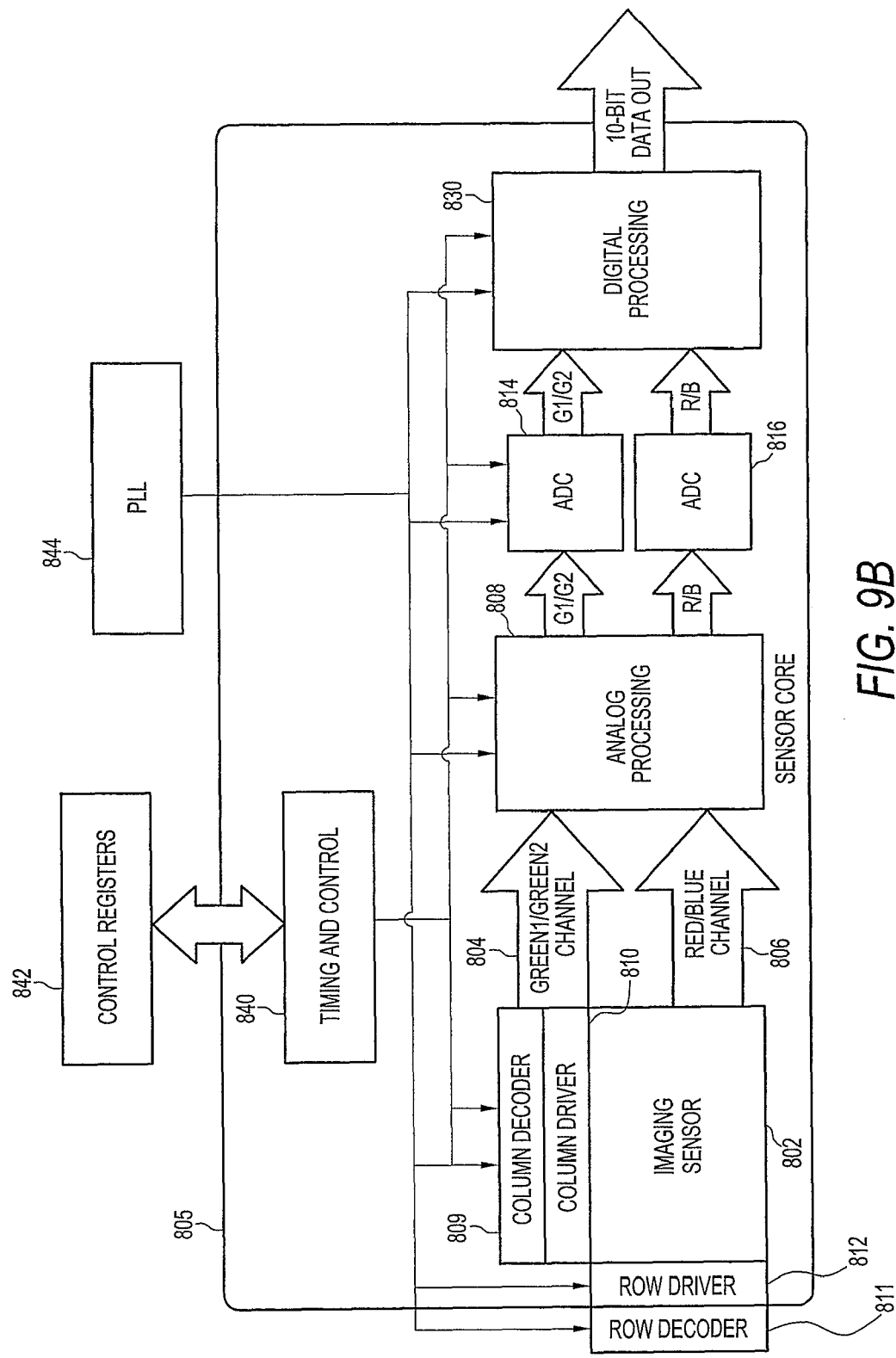
FIG. 9B illustrates an example of a sensor core used in the FIG. 9A device.

FIG. 9A shows system 900, a typical processor based system, which includes an imager 110 illustrated in FIG. 1 as an input device to the system 900. The imager 110 may also receive control or other data from system 900 as well. Examples of processor based systems, which may employ the imager 110, include, without limitation, computer systems, camera systems, scanners, machine vision systems, vehicle navigation systems, video telephones, surveillance systems, auto focus systems, star tracker systems, motion detection systems, image stabilization systems, and others.

The processes and devices described above illustrate exemplary methods and devices out of many that could be used and produced according to the present invention. The above description and drawings illustrate exemplary embodiments which achieve the objects, features, and advantages of the present invention. It is not intended, however, that the present invention be strictly limited to the above-described and illustrated embodiments. For example, the invention is not limited to the use of nanotextured silicon or porous silicon as a light trap. As noted, many other materials are suitable for use as such.

FIG. 9A illustrates a block diagram of an exemplary system-on-a-chip (SOC) imager 900 constructed in accordance with an embodiment. The imager 900 comprises a sensor core 805 having a pixel array that communicates with an image flow processor 910 that is also connected to an output interface 930. A phase locked loop (PLL) 844 is used as a clock for the sensor core 805. The image flow processor 910, which is responsible for image and color processing, includes interpolation line buffers 912, decimator line buffers 914, and a color pipeline 920. The color pipeline 920 includes, among other things, a statistics engine 922. The output interface 930 includes an output first-in-first-out (FIFO) parallel output 932 and a serial Mobile Industry Processing Interface (MIPI) output 934. The user can select either a serial output or a parallel output by setting registers within the chip. An internal register bus 940 connects read only memory (ROM) 942, a microcontroller 944 and a static random access memory (SRAM) 946 to the sensor core 805, image flow processor 910 and the output interface 930.

FIG. 9B illustrates a sensor core 805 used in the FIG. 9A imager 900. The sensor core 805 includes an imaging sensor 802, which is connected to a set of analog-to-digital converters 814 by a greenred/greenblue channel 804 and a red/blue channel 806. Although only two channels 804, 806 are illustrated, there are effectively two green channels, one red channel, and one blue channel, for a total of four channels. The greenred (i.e., Green 1) and greenblue (i.e., Green2) signals are readout at different times (using channel 804) and the red and blue signals are readout at different times (using channel 806). The analog-to-digital converters 814 processes greenred/greenblue signals G1/G2 or red/blue signals R/B and converts the signals from analog to digital form. The outputs of the analog-to-digital converter 814 are sent to a digital processor 830. The analog-to-digital converter 814 and associated analog processing circuits, e.g. sample and hold circuit, differential amplifier, analog amplifier, may be constructed as described in the embodiments discussed above.

Connected to, or as part of, the imaging sensor 802 are row and column decoders 811, 809 and row and column driver circuitry 812, 810 that are controlled by a timing and control circuit 840. The timing and control circuit 840 uses control registers 842 to determine how the imaging sensor 802 and other components are controlled, for example, controlling the mode of operation of the imaging sensor 802 (e.g., global reset mode or electronic rolling shutter). As set forth above, the PLL 844 serves as a clock for the components in the core 805.

The imaging sensor 802 comprises a plurality of pixel circuits arranged in a predetermined number of columns and rows. In operation, the pixel circuits of each row in imaging sensor 802 are all turned on at the same time by a row select line and other control lines and the pixel circuits of each column are selectively output onto column output lines by a column select line. A plurality of row and column lines are provided for the entire imaging sensor 802. The row lines are selectively activated by row driver circuitry 812 in response to the row address decoder 811 and the column select lines are selectively activated by a column driver 810 in response to the column address decoder 809. Thus, a row and column address is provided for each pixel circuit. The timing and control circuit 840 controls the address decoders 811, 809 for selecting the appropriate row and column lines for pixel readout, and the row and column driver circuitry 812, 810, which apply driving voltage to the drive transistors of the selected row and column lines.

Each column is connected to a processing circuit 814 containing sampling capacitors and switches that sample and hold a pixel reset signal Vrst and a pixel image signal Vsig. Because the core 805 uses greenred/greenblue channel 804 and a separate red/blue channel 806, processing circuits 814 will have the capacity to store Vrst and Vsig signals for greenred, greenblue, red, and blue pixel signals. A differential signal (Vrst-Vsig) is produced by differential amplifiers contained in the processing circuits 814 for each pixel. Thus, the signals G1/G2 and R/B are differential signals that are then digitized by a respective analog-to-digital converter within processing circuit 814. The processing circuits 814 supply digitized G1/G2, R/B pixel signals to the digital processor 830, which forms a digital image output (e.g., a 10-bit digital output). The digital processor 830 performs pixel processing operations. The output is sent to the image flow processor 910 (FIG. 9A).

Although the sensor core 805 has been described with reference to use with a CMOS imaging sensor, this is merely one example sensor core that may be used. Embodiments of the invention may also be used with other sensor cores having a different readout architecture. While the imager 900 (FIG. 9A) has been shown as a system-on-a-chip, it should be appreciated that the embodiments are not so limited. Other imagers, such as, for example, a stand-alone sensor core 805 coupled to a separate signal processing chip could be used in accordance with the embodiments.

Figure 10:
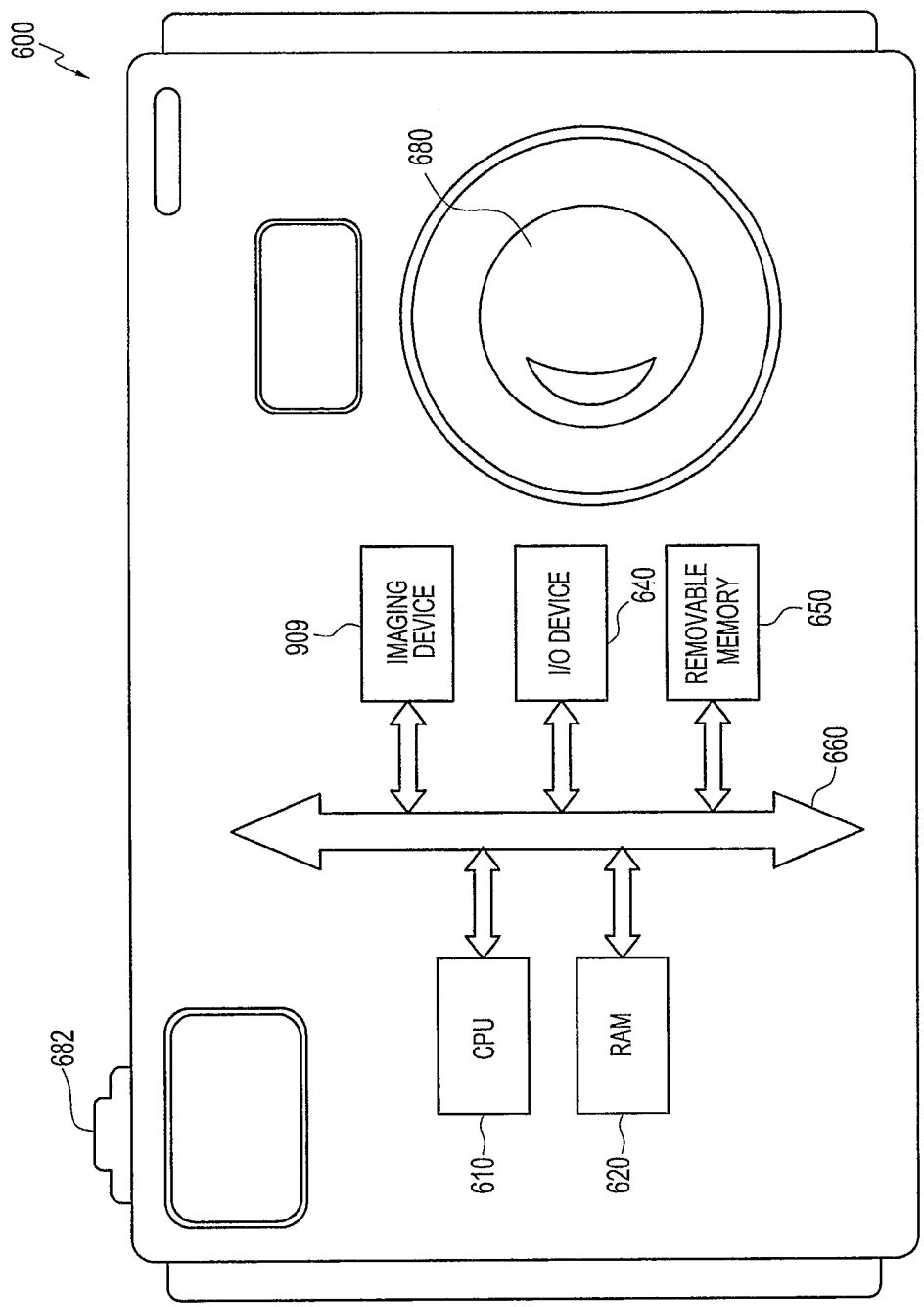
FIG. 10 shows an embodiment of a system, e.g. a camera system, incorporating at least one imager employing an embodiment described herein.

FIG. 10 shows a typical system 600, such as, for example, a camera system. The system 600 is an example of a system having digital circuits that could include imagers 900. Without being limiting, such a system could include a computer system, scanner, machine vision, vehicle navigation system, video phone, surveillance system, auto focus system, star tracker system, motion detection system, image stabilization system, and other systems employing an imager 900. Additionally, such a system could include the illustrated camera system, including a digital video camera, a digital still camera, or a digital single-lens reflex camera.

System 600, for example, a camera system, includes a lens 680 for focusing an image on the pixel array of the imager 900 when a shutter release button 682 is pressed. System 600 generally comprises a central processing unit (CPU) 610, such as a microprocessor that controls camera functions and image flow, and communicates with an input/output (I/O) device 640 over a bus 660. The imager 900 also communicates with the CPU 610 over the bus 660. The system 600 also includes random access memory (RAM) 620, and can include removable memory 650, such as flash memory, which also communicates with the CPU 610 over the bus 660. The imager 900 may be combined with the CPU 610, with or without memory storage on a single integrated circuit, such as, for example, a system-on-a-chip, or on a different chip than the CPU 610.

The above description and drawings are only to be considered illustrative of example embodiments of the invention. Many modifications, even substitutions of materials, can be made. Accordingly, the above description and accompanying drawings are only illustrative of the example embodiments.

What is claimed as new and desired to be protected by Letters Patent of the United States is:

1. An imager, comprising:
   a substrate comprising an array of imaging pixels;
   at least two metal regions, each metal region containing metal lines for routing signals;
   a light-absorptive region residing above the substrate that contains textured light-absorptive material, wherein the light-absorptive material is a material selected from the group consisting of Si, Ge, SiN, SiC, $TiO_2$, WSi, $S_3N_4$, and $Al_2O_3$; and
   transparent regions residing above the substrate, wherein each transparent region is mostly silicon dioxide.

2. An imager, comprising:
   a substrate comprising an array of imaging pixels;
   at least two metal regions, each metal region containing metal lines for routing signals;
   a light-absorptive region residing above the substrate that contains textured light-absorptive material; and
   transparent regions residing above the substrate, wherein the index of refraction of the light-absorptive material is at least 50% greater than the average index of refraction of the transparent regions.

3. The imager of claim 2, wherein the light-absorptive material is a material having an index of refraction of between 1.5 and 4.

4. The imager of claim 2, wherein the transparent regions have an average index of refraction of between 1.3 and 2.5.

* * * * *